United States Patent [19]

Maro et al.

[11] Patent Number: 5,059,337

[45] Date of Patent: Oct. 22, 1991

[54] SOFT MAGNETIC MATERIALS COMPRISING 9 TO 15 ATOMIC PERCENT CARBON ATOMS

[75] Inventors: Tsuyoshi Maro, Ibaraki; Osamu Kitakami, Toride; Hideo Fujiwara; Kunio Wakai, both of Ibaraki, all of Japan

[73] Assignee: Hitachi Maxell, Ltd., Osaka, Japan

[21] Appl. No.: 247,074

[22] Filed: Sep. 21, 1988

[30] Foreign Application Priority Data

Sep. 22, 1987 [JP] Japan ................. 62-238206

[51] Int. Cl.$^5$ ............... C04B 35/04; C04B 35/64; H01F 1/00; B22F 3/00
[52] U.S. Cl. ............... 252/62.54; 252/62.51; 252/62.55; 252/62.56; 252/62.59
[58] Field of Search ............... 252/62.54, 62.55, 62.51, 252/62.56, 62.59

[56] References Cited

U.S. PATENT DOCUMENTS

| | | | |
|---|---|---|---|
| 4,748,080 | 5/1988 | Itozawa | 252/62.54 |
| 4,794,042 | 12/1988 | Kubota et al. | 252/62.54 |
| 4,900,464 | 2/1990 | Arase et al. | 252/62.55 |

Primary Examiner—Prince E. Willis
Assistant Examiner—Jerry D. Johnson
Attorney, Agent, or Firm—Birch, Stewart, Kolasch & Birch

[57] ABSTRACT

The present invention provides a novel soft magnetic material superior in corrosion resistance which contains (a) a ferromagnetic metal and (b) a carbide of a ferromagnetic metal and/or a silicide of a ferromagnetic metal with at least one of (c) an amorphous carbon and/or an amorphous silicon and (d) a hydrocarbon polymer and/or a silicone polymer and which contains carbon atoms in an amount of 15 atomic % or less, preferably 9–15 atomic %, preferably prepared by the simultaneous vapor deposition of a ferromagnetic metal and a polymer.

9 Claims, 4 Drawing Sheets

SOFT MAGNETIC MATERIALS COMPRISING 9 TO 15 ATOMIC PERCENT CARBON ATOMS

FIELD OF THE INVENTION

The present invention relates to a soft magnetic material or a high magnetic permeability material. More particularly, it relates to a novel soft magnetic material comprising a ferromagnetic metal and a polymer.

PRIOR ART

Soft magnetic materials are used or being developed as magnetic cores of power transformers, heads for magnetic recording devices, ultrasonic vibrators, magnetostriction delay lines and the like.

Conventionally known alloy type soft magnetic materials include, for example, Permalloy (NiFe), FeSi and FeSiAl.

However, these alloy type soft magnetic materials have suffered from the problems that they gradually decrease in permeability when stored or used under high temperature and high humidity where the air contains salts or corrosive gas, such as sulfur dioxide, and they finally lose their functions.

SUMMARY OF THE INVENTION

The object of the present invention is to provide a novel soft magnetic material free from the above disadvantages. A further object of the present invention is to provide a soft magnetic material having a superior corrosion resistance.

DESCRIPTION OF THE INVENTION

Figure 1:
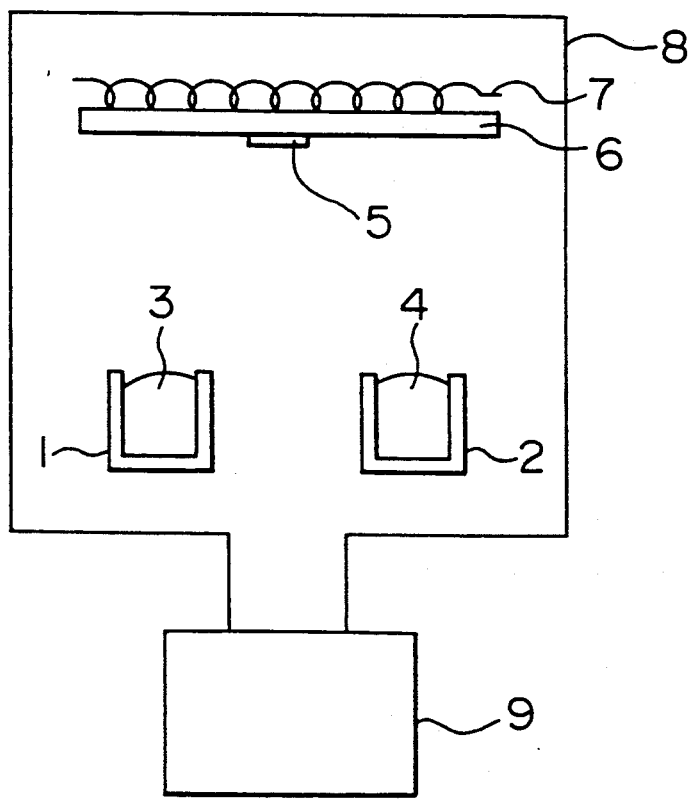
FIG. 1 shows a vacuum deposition apparatus used for the preparation of vapor deposition films in the examples and comparative examples given hereinafter.

It has been found that by simultaneous vacuum deposition of a ferromagnetic metal and a polymer from separate crucibles or hearths at a given vapor deposition rate, there can be obtained a novel soft magnetic material superior in corrosion resistance which contains at least (a) a ferromagnetic metal and (b) a carbide of a ferromagnetic metal and/or a silicide of a ferromagnetic metal with at least one of (c) an amorphous carbon and/or an amorphous silicon and (d) a hydrocarbon polymer and/or a silicone polymer and which contains carbon atoms in an amount of 15 atomic % or less, preferably 9-15 atomic %.

The ferromagnetic metal is selected from the group consisting of Fe, Co and Ni, alloys thereof, alloys of Fe, Co and Ni with other elements and nitrides and oxides of these metals and is preferably Fe or an Fe alloy.

The exact mechanism for how the deposited film becomes a soft magnetic material has not yet been determined, but it can be conjectured that carbon atoms or silicon atoms in the polymer combine with the ferromagnetic metal atoms to produce a carbide or silicide and simultaneously amorphous carbon or amorphous silicon and a hydrocarbon polymer or a silicone polymer are present as crystals, whereby crystal grains of the ferromagnetic metal become smaller and magnetic anisotropy of the crystals is levelled and becomes apparently zero and thus the film becomes a soft magnetic material.

In case of columnar metal particles, it is considered that the outer surface of the particles may be covered with the polymer in some cases, but in the metal columns, levelling of the magnetic anisotropy also occurs due to the above mentioned mechanism resulting in soft magnetization.

The feature of the soft magnetic material of the present invention is that the crystalline substance slightly remains. In fact, electron diffraction analysis or X-ray diffraction analysis of the soft magnetic material of the present invention shows a lattice pattern which indicates the presence of a crystalline substance.

When a ferromagnetic metal and a polymer are simultaneously vapor deposited, the polymer changes to various forms. That is, the polymer decomposes to form carbon atoms or silicon atoms, which combine with the ferromagnetic metal to produce a carbide or a silicide. Further, the carbon atoms or silicon atoms may change to an amorphous carbon or amorphous silicon. In addition, the polymer may be decomposed to small units and thus is present as the polymer having a reduced molecular weight. At present, it is technically very difficult if not impossible to determine the proportion present in an admixture by analysis.

However, it is possible to analyze the content per se of carbon atoms in the deposited film. Accordingly, it has been confirmed that when the content of carbon atoms in the film is 15 atomic % or less, the film exhibits a soft magnetic property while retaining a slight amount of crystal substance. When it exceeds 15 atomic %, the film becomes nearly amorphous. When the content of carbon atoms is less than 9 atomic %, the coercive force increases resulting in a loss of soft magnetic properties. Whether the film is of the hydrocarbon type or silicone type is determined by the polymer used. When the polymer used is of silicone type, the content of carbon atoms can be replaced by a content of silicon atoms. It is also possible to use a hydrocarbon polymer and a silicone polymer in combination. In this case, the objective effect of the present invention can be obtained if the total content of carbon atoms and silicon atoms is 15 atomic % or less.

The hydrocarbon polymer or silicone polymer in the soft magnetic film is in the form of a decomposition product of the original polymer and is considered to have, for example, the following recurring unit.

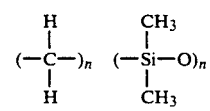

wherein n is a value within the range of from 1-100.

This recurring unit can have a side chain comprising other functional groups and further can also have a cyclic structure between the recurring units.

According to the present invention, as explained above, the mere vacuum deposition of a ferromagnetic metal and a polymer at the same time and at a specific deposition rate can overlay a soft magnetic film on a non-magnetic substrate at a probability of nearly 100%. Thus, this invention is superior in productivity.

From the point of productivity, simultaneous vacuum deposition of a ferromagnetic metal and a polymer is considered the best method for production of the soft magnetic film, but there may also be employed simultaneous sputtering of ferromagnetic metal and polymer or sputtering the ferromagnetic metal in a mixed gas of Ar and monomer or only the monomer with the ferromagnetic metal as a target. Furthermore, the ferromagnetic metal may be vacuum deposited simultaneously with plasma polymerization of the monomer gas. In addition, there may be employed simultaneous ion plating of the ferromagnetic metal and the monomer.

According to the process of the present invention, metals which have been generally, used as magnetic materials can normally be softly magnetized in any of the forms of a simple substance, an alloy and a compound.

Polymers usable for formation of the soft magnetic film of the present invention are linear or network polymers of 10-1000, preferably 30-500, more preferably 70-200 carbon atoms. Typical examples thereof are polyethylene, polypropylene, polystyrene, polybutadiene, polycarbonate, polyamide, polyimide, polyvinyl chloride, polyvinyl acetate and polyurethane. In addition, they may be polymers of fluor type such as polytetrafluoroethylene and those of silicon type based on Si.

PREFERRED EMBODIMENTS

The present invention will be explained in more detail by the following examples.

EXAMPLES 1-4

Soft magnetic films were prepared using the batch type vacuum deposition apparatus under the following conditions. In FIG. 1, 1 indicates a crucible for the ferromagnetic metal, 2 indicates a ferromagnetic metal, 3 indicates a crucible for the polymer, 4 indicates a polymer, 5 indicates a substrate, 6 indicates a holder for the substrate 5, 7 indicates a heater for heating of the substrate 5, 8 indicates a vacuum vessel and 9 indicates a vacuum vent system.

(1) Metal: Fe
(2) Polymer: Polyethylene (average molecular weight: 1000)
(3) Substrate: Glass, polyimide film (thickness: 40 μm)
(4) Substrate temperature: 150° C.
(5) Degree of vacuum: $2.0 \times 10^{-5}$ Torr (at deposition)
(6) Vapor deposition rate: as shown in the following Table 1.

TABLE 1

| Example | Fe (Å/s) | Polyethylene (Å/s) |
| --- | --- | --- |
| 1 | 15.2 | 1.5 |
| 2 | 16.1 | 1.8 |
| 3 | 14.4 | 2.9 |
| 4 | 13.2 | 5.7 |

Fe was vacuum deposited by electron gun heating and polyethylene was deposited by resistance heating.

COMPARATIVE EXAMPLES 1-3

Vapor deposited films were prepared under the same film forming conditions as in Examples 1-4 except that deposition rate was changed as shown in the following Table 2.

TABLE 2

| Comparative Example | Fe (Å/s) | Polyethylene (Å/s) |
| --- | --- | --- |
| 1 | 20.0 | 0 |
| 2 | 19.0 | 0.4 |
| 3 | 18.0 | 0.7 |

Composition of the deposited films obtained in Examples 1-4 and Comparative Examples 1-3 was determined by XPS (X-ray Photoelectron Spectroscopy). The results are shown in Table 3.

TABLE 3

| | Fe (atomic %) | C (atomic %) |
| --- | --- | --- |
| Example | | |
| 1 | 90 | 10 |
| 2 | 89 | 11 |
| 3 | 86 | 14 |
| 4 | 85 | 15 |
| Comparative Example | | |
| 1 | 100 | 0 |
| 2 | 95 | 5 |
| 3 | 92 | 8 |

Figure 2:
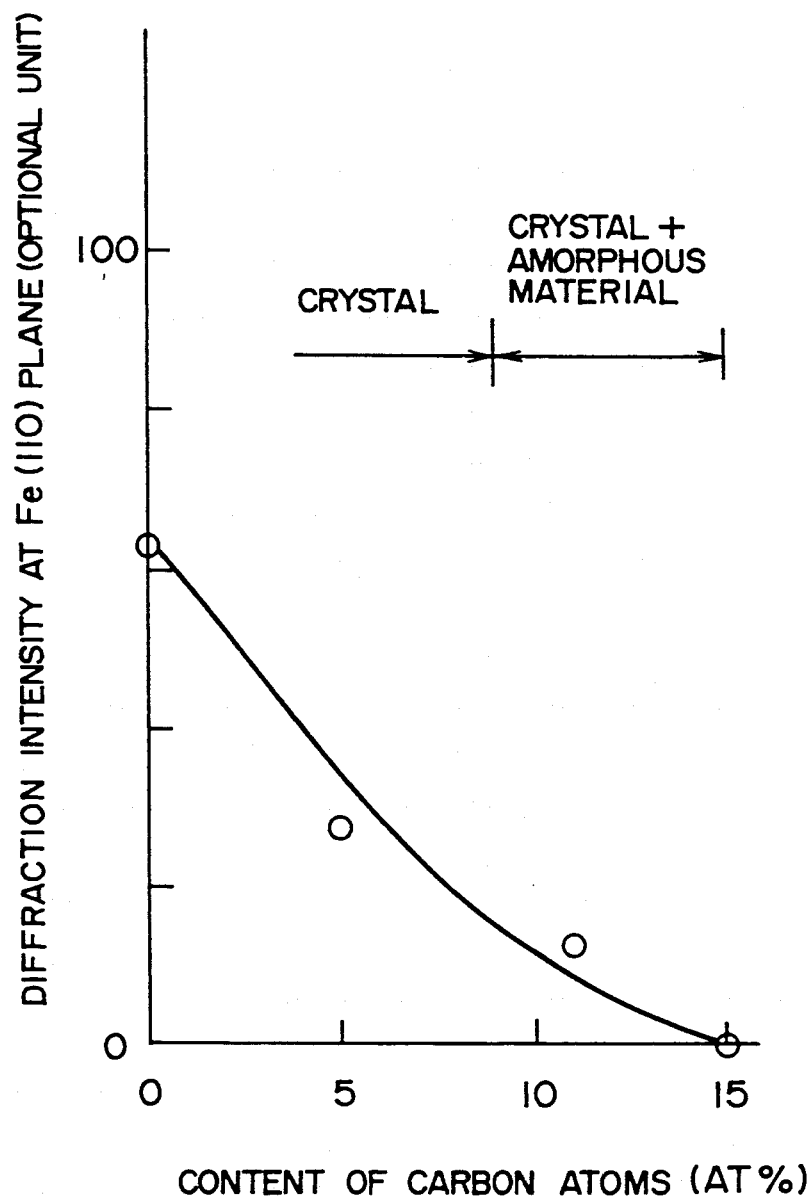
FIG. 2 is a characteristic graph which indicates the relation between the content of carbon atoms in a deposited film and its diffraction intensity at the Fe (110) plane.

The crystallinity of the deposited films obtained in Examples 1-4 and Comparative Examples 1-3 was determined from diffraction intensity at Fe (110) measured by X-ray diffractometry. The results are shown in FIG. 2. Similarly, the coercive force of these deposited films was measured by vibrating sample magnetometer. The results are shown in FIG. 3.

As can be seen from FIG. 2, the crystalline substance remained in the region of 15 atomic % or less in carbon atom content. When less than 9 atomic %, the film was completely crystalline, while both a crystalline substance and amorphous substance are present in an admixture when 9-15 atomic %.

Figure 3:
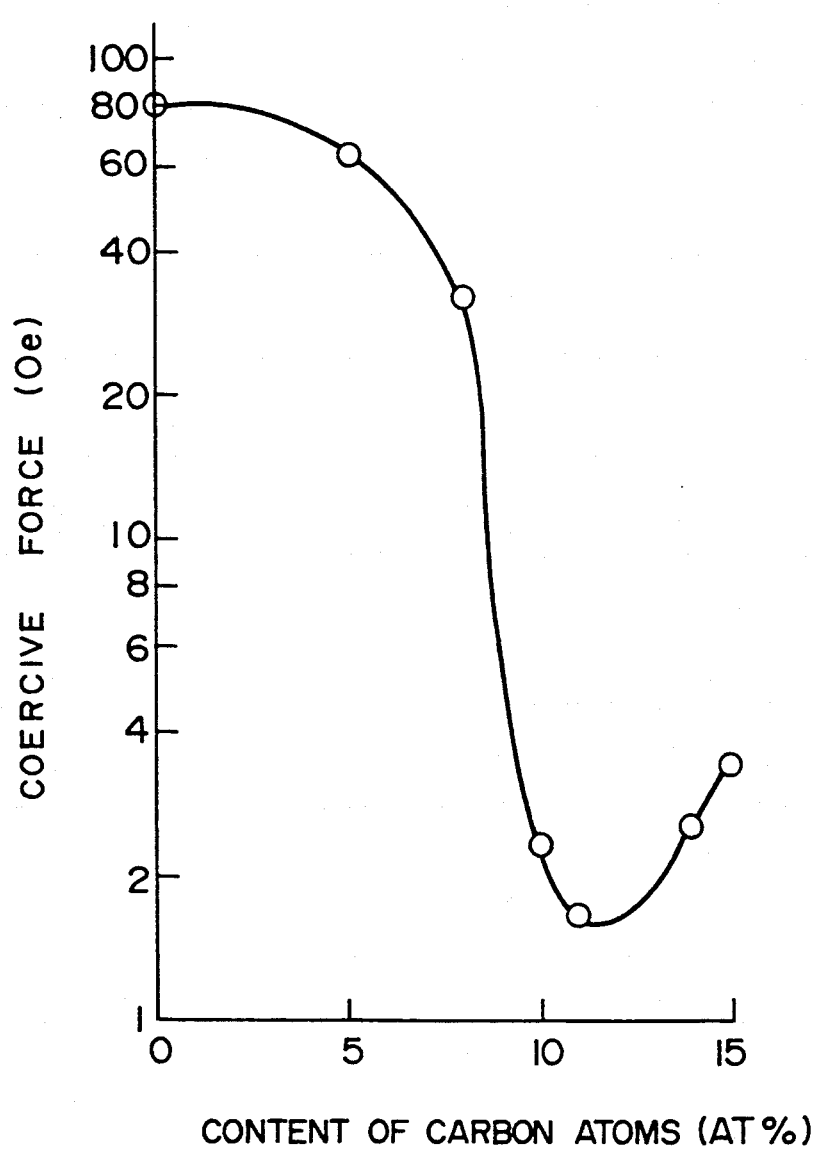
FIG. 3 is a characteristic graph which shows the relation between the content of carbon atoms in a deposited film and its coercive force.

Furthermore, as is clear from FIG. 3, the film can be said to have a soft magnetic property from the point of the coercive force when the carbon atom content is within the range of 9-15 atomic %, where both the crystalline substance and amorphous substance are present.

EXAMPLE 5

A soft magnetic film was prepared using the batch type vacuum deposition apparatus as shown in FIG. 1 under the following conditions.

(1) Substrate: Glass (ϕ10)
(2) Substrate temperature: 100° C.
(3) Ferromagnetic metal: FeBi (Bi concentration in ingot 2 at %)
(4) Polymer: Polyethylene (Average molecular weight 1000)
(5) Degree of vacuum:
$4 \times 10^{-7}$ Torr (Ultimate)
$5 \times 10^{-5}$ Torr (at deposition of FeBi-polyethylene)
(6) Vapor deposition rate:
FeBi 30 Å/sec
Polymethylene 5 Å/sec FeBi was vacuum deposited by electron gun heating and polyethylene deposited by resistance heating. Thickness of the deposited film was 0.5 μm.

EXAMPLE 6

A soft magnetic film was prepared using the batch type vacuum deposition apparatus shown in FIG. 1 under the following conditions.

Conditions:

(1) Substrate: Glass (φ10)
(2) Substrate temperature: Room temperature
(3) Ferromagnetic metal: CoNiFe [Ingot used for vapor deposition: $Co_{10}Ni_{81}Fe_{19}$) 90 wt. %]
(4) Polymer: Polyethylene (Average molecular weight: 1000)
(5) Degree of vacuum:
$4 \times 10^{-7}$ Torr (ultimate)
$5 \times 10^{05}$ Torr (at formation of CoNiFe-polyethylene film)
(6) Vapor deposition rate:
CoNiFe 50 Å/sec
Polyethylene 10 Å/sec CoNiFe was deposited by electron gun heating and polyethylene was deposited by resistance heating. Thickness of the deposited film was 1 μm.

EXAMPLE 7

CoCr-polyethylene film was prepared in the same manner as in Example 5 except that CoCr alloy (Cr concentration in ingot: 8 wt. %) was used in place or FeBi. Thickness of the deposited film was 1.0 μm.

COMPARATIVE EXAMPLE 4

An FeBi film of 0.5 μm in thickness was prepared in the same manner as in Example 5 except that deposition of the polymer was not effected and deposition of only FeBi was effected and degree of vacuum at deposition was $1.0 \times 10^{05}$ Torr.

COMPARATIVE EXAMPLE 5

A CoNiFe film of 1 μm in thickness was prepared in the same manner as in Example 6 except that only CoNiFe was deposited and degree of vacuum at deposition was $1.0 \times 10^{-5}$ Torr.

COMPARATIVE EXAMPLE 6

An NiFe (Permalloy) film of 1.0 μm in thickness was prepared in the same manner as in Comparative Example 5 except that NiFe alloy (Ni concentration in ingot: 80 wt. %) was used in place of FeBi.

Magnetic characteristics of the FeBi-polyethylene film obtained in Example 5 and FeBi film obtained in Comparative Example 4 were measured by VSM (vibrating sample magnetometer). Results are shown in Table 4.

TABLE 4

| | Saturation magnetization (G) | Coercive force Hc(Oe) | Anisotropic magnetic field Hk(Oe) |
|---|---|---|---|
| Example 5 | 1300 | 10 | 50 |
| Comparative Example 4 | 1500 | 400 | 5000 |

Next, crystal structure of the films was determined by X-ray diffractometry. For both the Fe-Bi-polyethylene film and Fe-Bi film, a peak at Fe (110) plane was found.

Results of the measurement are shown in following Table 5.

TABLE 5

| | Diffraction intensity at Fe (110) plane (CPS) | Hall-width of the peak at Fe (110) plane |
|---|---|---|
| Example 5 | 1,000 | 30 |
| Comparative Example 4 | 10,000 | 10 |

According to electron diffraction of the films, FeBi film showed spot pattern because of good orientation at Fe (110) plane in the direction vertical to the surface of the film while FeBi-polyethylene film showed polycrystalline ring pattern of Fe.

Analysis of the FeBi--polyethylene film by XPS showed that carbon in the FeBi-polyethylene film was present mainly as carbide with FeBi and amorphous carbon.

From the above, it can be seen that in the FeBi-polyethylene film, FeBi becomes particulate and magnetic anisotropy of crystal is levelled and thus the film is soft magnetized.

Magnetic characteristics of the CoNiFe-polyethylene film obtained in Example 6 and the CoNiFe film obtained in Comparative Example 5 were measured by vibrating sample magnetometer (VSM). The measurement was effected by applying magnetic field in the direction parallel to the sample surface. The results are shown in the following Table 6.

TABLE 6

| | Saturation magnetization (G) | Coercive force Hc(Oe) | Anisotropic magnetic field Hk(Oe) |
|---|---|---|---|
| Example 6 | 840 | 2 | 10 |
| Comparative Example 5 | 860 | 10 | 40 |

The above results show that the CoNiFe-polyethylene film was soft magnetized.

Analysis of the CoNiFe-polyethylene film by XPS showed that carbon in the film was present mainly as carbide, amorphous carbon and $(-CH_2-)_n$.

Magnetic characteristics of the CoCr-polyethylene film obtained in Example 7 and Permalloy (NiFe) film obtained in Comparative Example 6 were measured by vibrating sample magnetometer (VSM). The results are shown in Table 7.

TABLE 7

| | Saturation magnetization (G) | Coercive force Hc(Oe) | Anisotropic magnetic field Hk(Oe) |
|---|---|---|---|
| Example 7 | 750 | 8.0 | 20 |
| Comparative Example 6 | 800 | 20.0 | 180 |

Analysis of this CoCr-polyethylene film by XPS showed that carbon in the film was present mainly as carbide with CoCr and $(-CH_2-)_n$.

Corrosion resistance of the soft magnetic films obtained in Examples 4 and 7 and Permalloy (NiFe) film obtained in Comparative Example 6 were determined in the following manner.

The surface of the film was uniformly sprayed with 1% aqueous NaCl solution and the film was left to stand in a thermostatic chamber at 30° C. This sample was taken out every day and was measured for magnetic permeability by impedance method. The measurement was effected after wiping off the NaCl solution on the surface of the sample. After measurement, the sample was again sprayed with NaCl solution and returned to the thermostatic chamber.

Figure 4:
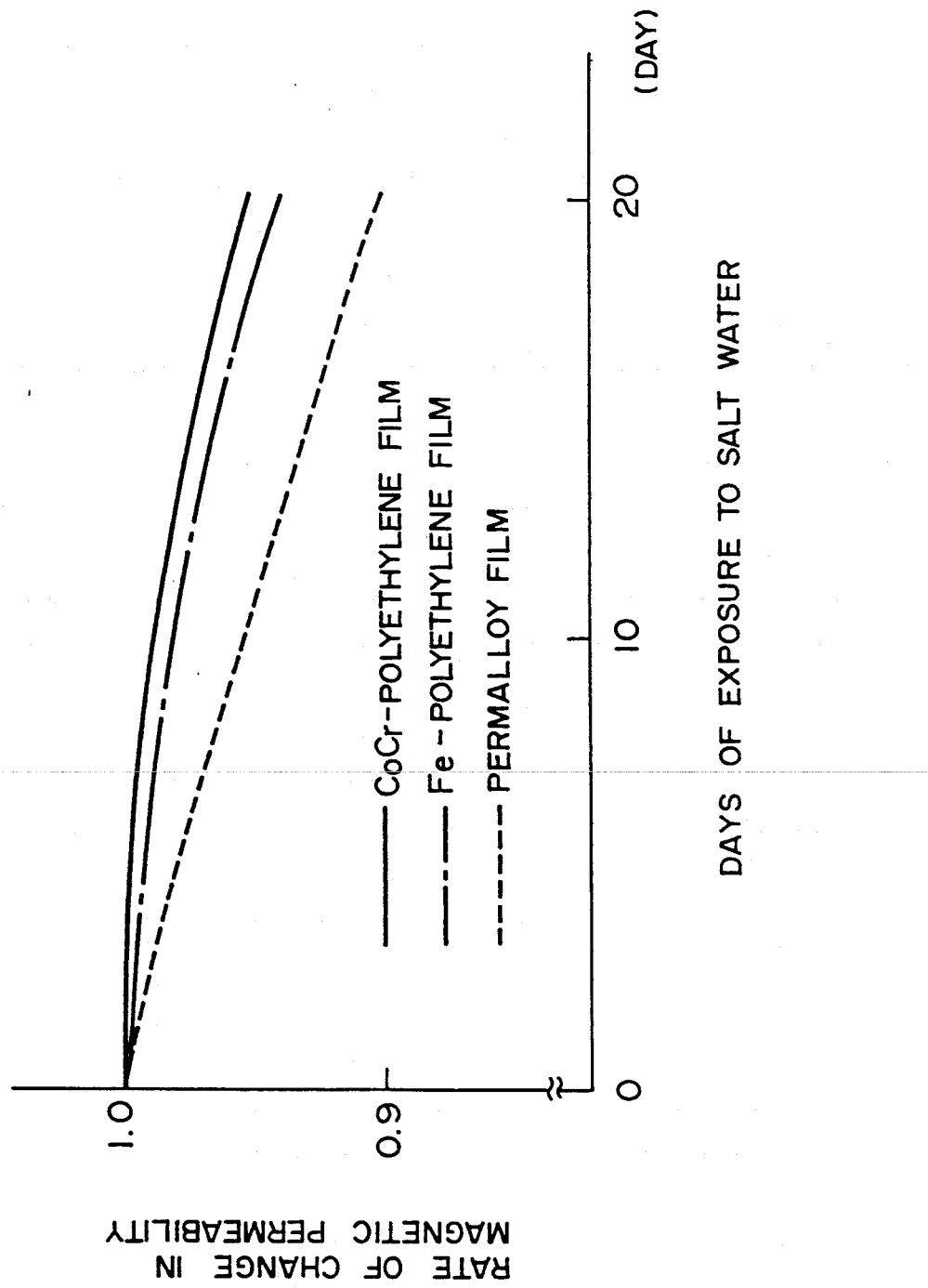
FIG. 4 shows a characteristics graph which compares the corrosion resistance of the soft magnetic films, i.e. Fe-polyethylene film and CoCr-polyethylene film according to the present invention, with that of a conventional Permalloy film.

Results of measurement are shown in FIG. 4. The ordinate axis indicates rate of change of magnetic permeability. The rate of change of magnetic permeability ($\Delta\mu$) was calculated by the following formula.

$$\Delta\mu = \mu/\mu i$$

In the above formula, $\mu i$ indicates magnetic permeability before spraying of NaCl solution and $\mu$ indicates magnetic permeability measured after spraying NaCl solution.

As is clear from the results shown in FIG. 4, the materials comprising a polymer and a ferromagnetic metal according to the present invention were soft magnetized and was superior to conventional permalloy soft magnetic film in corrosion resistance.

As explained hereabove, according to the present invention, soft magnetic materials are obtained by combining a polymer and a ferromagnetic metal where the polymer is converted to (a) and (b), (a) and (c) or (a), (b) and (c) wherein (a) means a carbide or silicide of ferromagnetic metal, (b) means amorphous carbon or amorphous silicon and (c) means hydrocarbon polymer or silicone polymer. The resulting soft magnetic materials are superior to conventional soft magnetic films in corrosion resistance.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A soft magnetic material which comprises (a) a ferromagnetic metal, (b) at least one member selected from the group consisting of a carbide of said ferromagnetic metal and a silicide of said ferromagnetic metal and (c) at least one member selected from the group consisting of amorphous carbon and amorphous silicon, wherein said soft magnetic material has a carbon atom content of from 9 to 15 atomic %.

2. A soft magnetic material according to claim 1, wherein said ferromagnetic metal is selected from at least one member of the group consisting of Fe, Co and Ni, alloys, nitrides and oxides thereof.

3. A soft magnetic material according to claim 2, wherein said ferromagnetic metal is Fe or an Fe alloy.

4. A soft magnetic material which comprises (a) a ferromagnetic metal, (b) at least one member selected from the group consisting of a carbide of said ferromagnetic metal and a silicide of said ferromagnetic metal and (c) at least one member selected from the group consisting of a hydrocarbon polymer and a silicone polymer, wherein said soft magnetic material has a carbon atom content of from 9 to 15 atomic %.

5. A soft magnetic material according to claim 4, wherein said ferromagnetic metal is selected from at least one member of the group consisting of Fe, Co and Ni, alloys, nitrides and oxides thereof.

6. A soft magnetic material according to claim 5, wherein said ferromagnetic metal is Fe or an Fe alloy.

7. A soft magnetic material which comprises (a) a ferromagnetic metal, (b) at least one member selected from the group consisting of a carbide of said ferromagnetic metal and a silicide of ferromagnetic metal, (c) at least one member selected from the group consisting of amorphous carbon and amorphous silicon and (d) at least one member selected from the group consisting of a hydrocarbon polymer and a silicone polymer, wherein said soft magnetic material has a carbon atom content of from 9 to 15 atomic %.

8. A soft magnetic material according to claim 7, wherein said ferromagnetic metal is selected from at least one member of the group consisting of Fe, Co and Ni, alloys, nitrides and oxides thereof.

9. A soft magnetic material according to claim 8, wherein said ferromagnetic metal is Fe or an Fe alloy.

* * * * *